(12) United States Patent
Cunning

(10) Patent No.: US 6,307,439 B2
(45) Date of Patent: *Oct. 23, 2001

(54) VOLTAGE CONTROLLED OSCILLATOR WITH ADAPTIVE CLOSED LOOP COARSE TUNE

(75) Inventor: Michael D. Cunning, Paola, KS (US)

(73) Assignee: Garmin Corporation (TW)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/198,224

(22) Filed: Nov. 23, 1998

(51) Int. Cl.⁷ .................................. H03L 7/93; H03B 1/00
(52) U.S. Cl. .................................. 331/10; 331/16; 331/17; 331/177 R
(58) Field of Search .................. 331/10, 177 R, 331/16, 17; 327/156

(56) References Cited

U.S. PATENT DOCUMENTS

| | | | |
|---|---|---|---|
| 4,009,448 | * 2/1977 | Hopwood et al. | 331/4 |
| 4,203,070 | 5/1980 | Bowles et al. | 375/1 |
| 4,223,406 | * 9/1980 | Someno | 455/180 |
| 4,232,395 | 11/1980 | Yokogawa | 455/173 |
| 4,247,939 | 1/1981 | Stromswold et awl. | 375/1 |
| 4,380,745 | 4/1983 | Barlow et al. | 331/176 |
| 4,580,289 | 4/1986 | Enderby | 455/314 |
| 4,627,100 | 12/1986 | Takano | 455/160 |
| 4,684,904 | * 8/1987 | Watkins et al. | 331/117 R |
| 4,754,465 | 6/1988 | Trimble | 375/1 |
| 4,921,467 | 5/1990 | Lax | 455/264 |
| 5,081,431 | 1/1992 | Kubo et al. | 33/158 |
| 5,108,334 | 4/1992 | Eschenbach et al. | 455/314 |
| 5,225,842 | 7/1993 | Brown et al. | 342/357 |
| 5,307,515 | 4/1994 | Kuo et al. | 455/295 |
| 5,323,164 | 6/1994 | Endo | 342/357 |
| 5,329,546 | 7/1994 | Lee | 375/1 |
| 5,392,005 | 2/1995 | Bortolini et al. | 331/44 |
| 5,434,789 | 7/1995 | Fraker et al. | 364/460 |

OTHER PUBLICATIONS

James A Crawford, Frequency Synthesizer Design Handbook, 1994, p. 249.*

* cited by examiner

*Primary Examiner*—Robert Pascal
*Assistant Examiner*—Kimberly E Glenn
(74) *Attorney, Agent, or Firm*—Devon A. Rolf

(57) ABSTRACT

A voltage controlled oscillator circuit incorporating a closed loop coarse tuning mechanism. In this system, a reference oscillator is set with the desired frequency for the voltage controlled oscillator. A resulting voltage used to drive the oscillator is produced by a synthesizer connected in series with a loop filter. The resulting voltage is connected to a fine tune input of the voltage controlled oscillator and also to the input of an adaptive closed loop coarse tuning mechanism. The adaptive closed loop coarse tuning mechanism is comprised of an op amp configured in a noninverting feedback loop connected to a parallel resistor/adapt switch loop. The loop is followed by a shunt capacitor filter which is then connected directly to the coarse tune input of the VCO. If the adapt switch is closed, current from the coarse amp flows through a filter and to a coarse tune port of the VCO. The voltage resulting from the adaptive closed loop coarse tuning mechanism overrides any voltage being received in the fine tune port, making the coarse tune loop controlling in frequency acquisition. Throughout the entire coarse tune process, a feedback loop allows the synthesizer to adjust the control voltage as the VCO gets closer to the desired frequency. After a predetermined acquisition time, the adapt switch is opened. This virtually eliminates the adaptive closed loop tuning mechanism from the circuit because of the large time constant associated with the (closed) adapt switch/resistor circuit. At that point the fine tune port voltage will make any minor adjustments in driving the VCO to the desired frequency.

17 Claims, 4 Drawing Sheets

VOLTAGE CONTROLLED OSCILLATOR WITH ADAPTIVE CLOSED LOOP COARSE TUNE

BACKGROUND OF THE INVENTION

Field of Invention

In general, this invention relates to a communication device utilizing voltage controlled oscillators and more specifically to a voltage controlled oscillator circuit incorporating an adaptive closed loop coarse tuning mechanism.

Description of the Related Art

Voltage controlled oscillators (VCO) are well known in the field of communication devices. In general, the operating frequency of a VCO is controlled by the application of a voltage to a tuning varactor incorporated into the VCO design. Some communication devices implement a single varicap diode to apply corresponding reference voltages over an entire band of desired frequencies. The problem encountered when using a single varicap diode is that the VCO becomes sensitive to noise and experiences reference frequency leakage in the case of high VCO gain. In some devices, this problem is addressed by varying the closed loop bandwidth of a single loop filter using an adapt switch to change the loop filter components. Such single loop adaptive filtering requires multiple switches and filters to cover a desired frequency range.

As an alternative solution, the problem of noise and frequency leakage is overcome by dividing the frequency band into sub-bands using either diode switches or dual tuning diodes from two varicap diodes, one for coarse tuning and the other for fine tuning. When using dual tuning diodes, the coarse tune varaetor is normally controlled open loop using a D/A converter. A problem with this approach, however, is that the voltage produced by the D/A converter for each individual communication device must be calibrated over the entire band, substantially increasing the overall system cost per unit. As an alternative, the VCO is sometimes installed with microstrip line etching containing precalibrated frequencies for the entire band. The microstrips are driven by an adapt switch connected directly to the VCO. However, initial calibration of the microstrip etching requires laser trimming which equates to a large up front cost, thereby also substantially increasing the cost per unit. Because single varicap adaptive filtering does not effectively reduce noise without multiple components and because a D/A converter and microstrip line etching increase overall system costs, a need exists for a less expensive, single unit coarse tuning mechanism.

SUMMARY OF THE INVENTION

Based on the above noted deficiencies in the related art, it is an object of the present invention to eliminate the need for individual calibration per unit of the coarse tune voltage across a band of desired frequencies. It is the further object to reduce VCO gain while eliminating the need for a D/A converter and without sacrificing resolution. Still another object is to allow for adaptive VCO sensitivity without the need and implementation of switching diodes. Finally, it is the object to offer a noise reduction advantage over single loop adaptive filtering used in VCOs.

These and other objects of the present invention are achieved by the incorporation of an adaptive closed loop coarse tuning mechanism into a voltage controlled oscillator (VCO) circuit. Particularly, a reference oscillator is set with the desired frequency for the VCO. The resulting wave form is sent to a synthesizer, which is connected in series with the reference oscillator. The synthesizer then compares the reference frequency to the frequency at which the VCO is currently set and a charge pump within the synthesizer converts any phase difference between the two frequencies into a corresponding current that is proportional to the phase difference. If there is no phase difference, the charge pump will not emit a current, as the VCO is presently at the desired frequency. Therefore, the greater the phase difference, the higher the current the charge pump will produce.

Connected in series with the synthesizer is a loop filter which receives the incoming current from the synthesizer and produces a corresponding voltage. This voltage is applied directly to the fine tune port of the VCO. In addition, the adaptive closed loop coarse tuning mechanism is connected in parallel with the fine tune port and develops the same voltage, which is the reference voltage for the coarse tune.

The adaptive closed loop coarse tuning mechanism consists of an configured in a noninverting feedback loop connected to a parallel resistor/adapt switch. The switch is followed in series by a shunt capacitor filter which is connected directly to the coarse tune input of the VCO. When the adapt switch is closed, the voltage produced by the coarse amp flows through the filter and to the coarse tune port of the VCO. The voltage resulting from the adaptive closed loop coarse tune overrides any voltage being received in the fine tune port making the coarse tune loop controlling in frequency acquisition. This process is known as the wide band (fast lock) mode. After a preset time has expired, the adapt switch is opened thereby effectively eliminating the coarse tune circuit from the loop because of a large time constant associated with the parallel adapt switch/resistor circuit. At that point, the fine tune port voltage will make any minor adjustments in driving the VCO to the desired frequency. This process is known as the narrow band (low noise) mode.

These as well as other novel advantages, details, embodiments, features, and objects of the present invention will be apparent skilled in the art from the following detailed description of the invention, the attached claims and accompanying drawings, listed herein below, which are useful in explaining the invention.

BRIEF DESCRIPTION OF THE DRAWINGS

Objects and features of the invention noted above are explained in more detail with reference to the drawings, and in which like reference numerals are used to indicate like parts in the various views.

DETAILED DESCRIPTION OF THE PREFERRED EMBODIMENTS

For better understanding of the present invention, reference may be had to the following detailed description taken in conjunction with the appended claims and accompanying drawings. In essence, the present invention enables a voltage controlled oscillator to acquire a desired frequency with the use of a coarse tune varactor. At the same time, the coarse tune varactor is implemented without the need to calibrate the coarse tune voltage across the desired band of frequencies, without sacrificing VCO sensitivity and resolution and without the implementation of a D/A converter.

Figure 1:
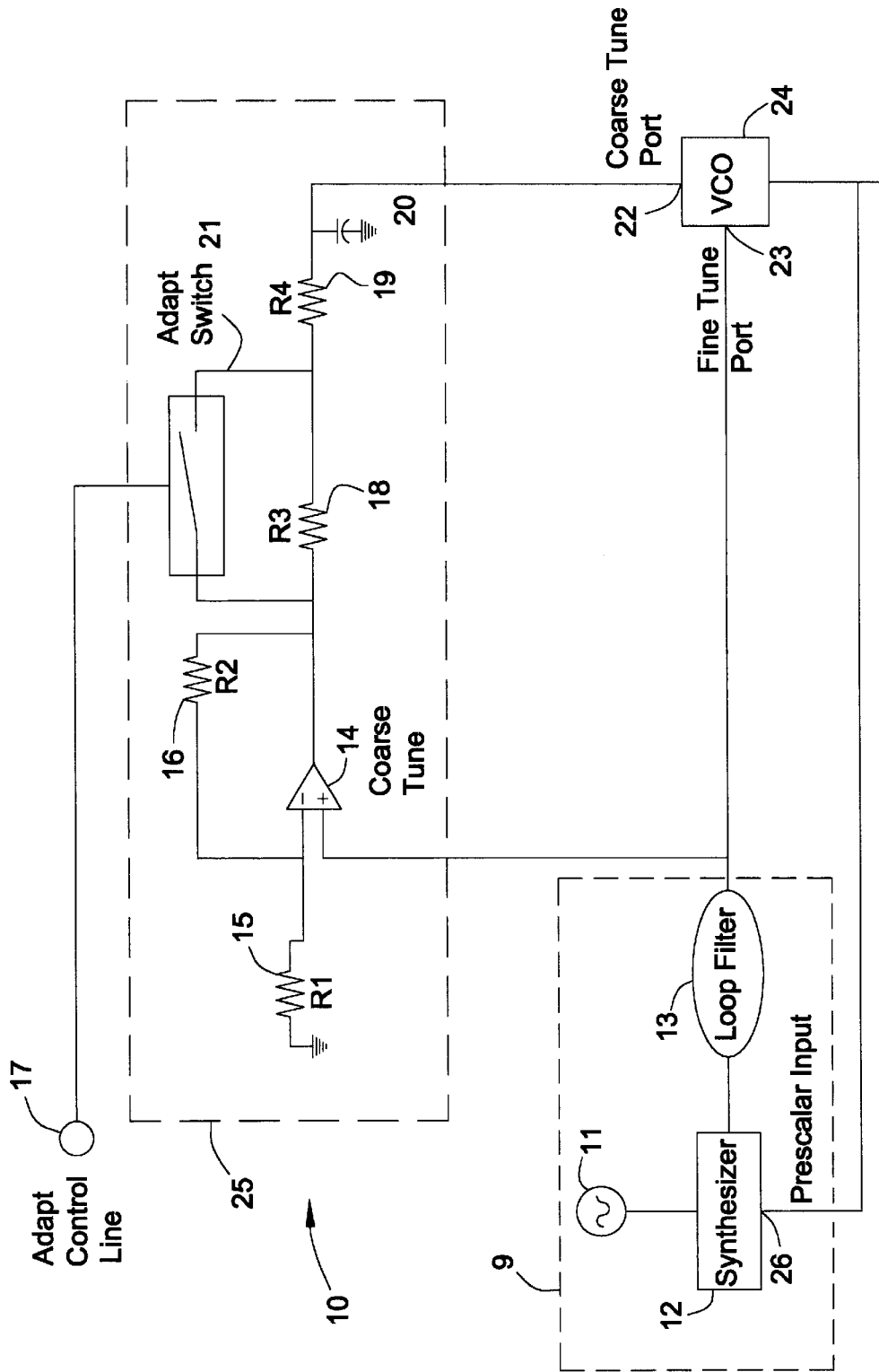
FIG. 1 is a schematic of the voltage controlled oscillator with an adaptive closed loop coarse tuning mechanism circuit of the present invention.

In the preferred embodiment, FIG. 1 represents the voltage controlled oscillator (VCO) circuit designated generally by reference numeral 10. The VCO circuit includes a fine tune varactor 9 comprised of a reference oscillator 11 connected in series with a synthesizer 12 which is connected in series with a loop filter 13. Typically, the loop filter 13 is comprised of a resistor and a capacitor. The output of the loop filter 13 is connected directly to the fine tune port 23 of the VCO 24.

Connected in parallel to the fine tune port is the adaptive closed loop coarse tuning mechanism 25, designated generally by reference numeral 25. Within the adaptive closed loop coarse tuning mechanism 25 is a coarse amp 14 configured in a noninverting feedback loop with the loop filter 13 output connected to the positive input of the coarse amp 14. The noninverting feedback loop of the coarse amp 14 is configured with a 10 KΩ resistor 15 and a 1 KΩ resistor 16. It will be appreciated by someone skilled in the relevant art that other combinations of resistor values could be substituted for those identified. At the output of the coarse amp 14 is an adapt switch 21 of little or no resistance and, in parallel, a 1 MΩ resistor 18. In series with the adapt switch 21/resistor 18 loop is a 50 KΩ resistor 19. This resistor 19 is used in conjunction with a parallel 0.1 μF shunt capacitor 20 to filter out additional noise. The output of the resistor 19 and shunt capacitor 20 is connected to the coarse tune port 22 of the VCO 24. The VCO 24 then relays its frequency back to the synthesizer 14 via the prescalar input line 26.

Figure 2:
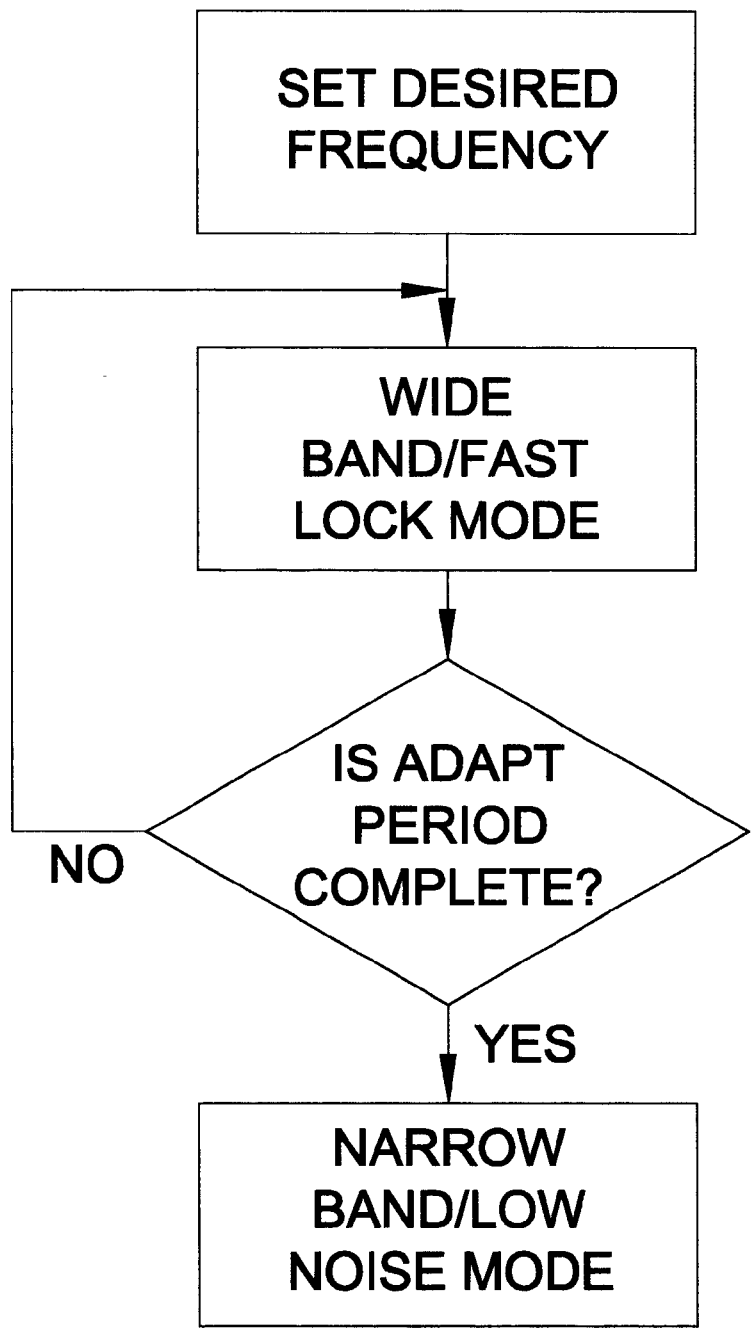
FIG. 2 is a flow diagram of frequency acquisition utilizing an adaptive closed loop coarse tuning mechanism circuit of the present invention.

In general, FIG. 2 represents a flow diagram of the implementation of the adaptive closed loop coarse tuning mechanism. External controls (not shown) load the reference oscillator 11 with the frequency desired for the VCO 24 as represented in Step S200. The resulting wave form is sent to the synthesizer 12 which also contains the present VCO 24 frequency as loaded in the prescalar input line 26. The synthesizer 12 internally divides down both frequencies and compares the reference frequency to the VCO 24 frequency. The phase difference, if any, between the wave forms causes a charge pump within the synthesizer 14 to produce a current proportional to the phase difference. The loop filter 13, connected in series, receives the current produced by the charge pump and a resulting voltage appears as the current flows into a capacitor located within the loop filter 13.

The resulting voltage is sensed by the fine tune port 23 of the VCO 24, which begins to drive the VCO 24. In parallel to the fine tune port 23 is the coarse amp 14 of the adaptive closed loop coarse tuning mechanism 25. If the adapt control switch 21 of the coarse tune amp is closed, the voltage from filtered coarse 13 drives the coarse amp 14. The closing of the adapt switch initiates the wide band fast lock mode as represented in FIG. 2 by Step S210.

Figure 3:
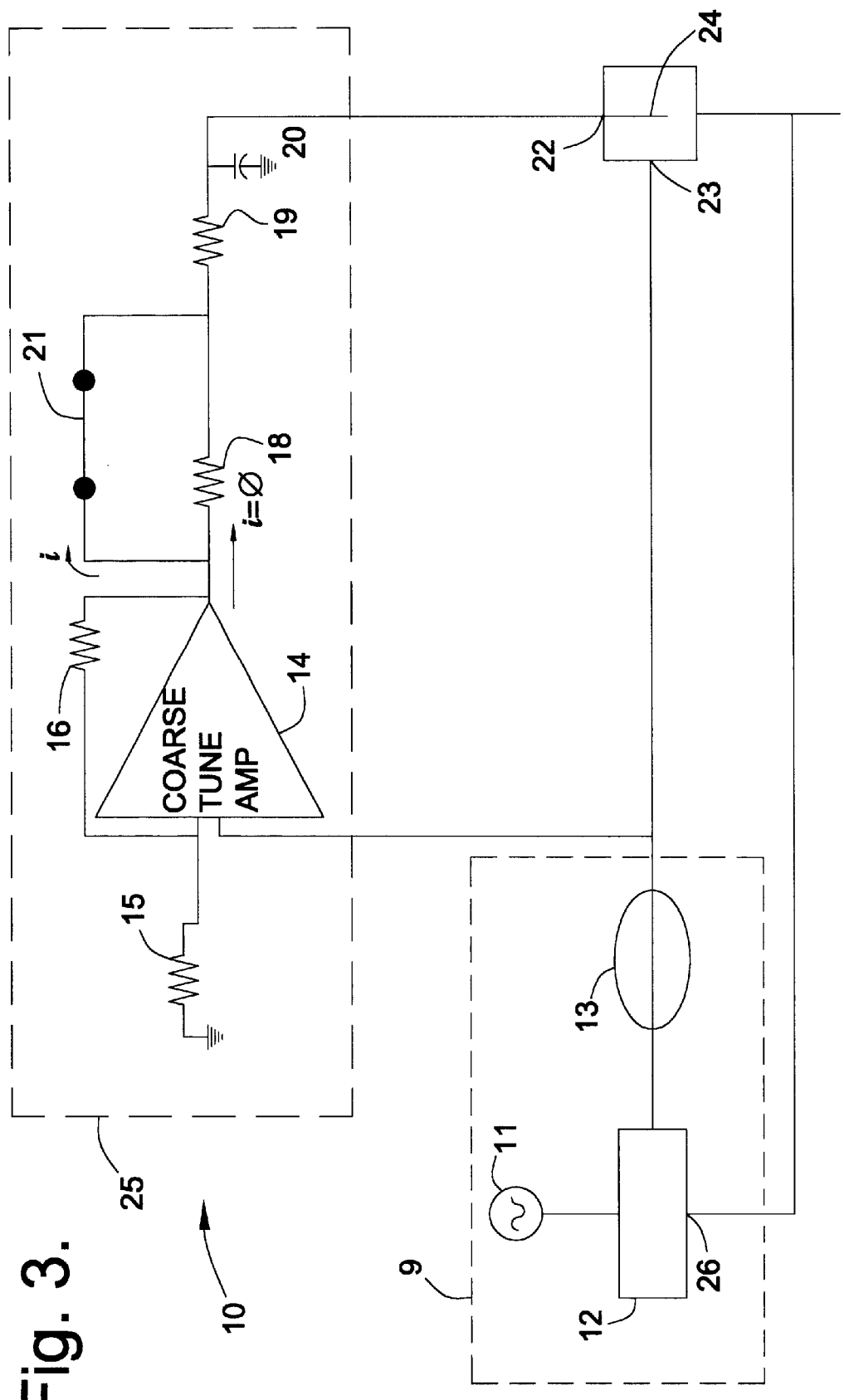
FIG. 3 is a schematic of the adaptive closed loop coarse tuning mechanism circuit of the present invention during the wide band fast lock acquisition mode.

FIG. 3 is a schematic of the adaptive closed loop coarse tuning mechanism in wide band fast lock mode. Because the adapt switch 21 has little or no resistance, a short circuit exists and all of the current produced by the coarse amp 14 feedback loop flows directly to the filter resistance 19 bypassing the parallel resistor 18. At this point, the voltage produced by the coarse amp 14 is filtered by the series resistor 19, and shunt capacitor 20. The output of the filter is directly connected to the coarse tune input 22 of the VCO 24. The filtered voltage produced by the coarse amp 14 drives the VCO 24. Throughout the entire coarse tune period, the VCO 24 will relay its changing frequency via the prescalar input line 26 to the synthesizer which will adjust the reference current accordingly.

The adaptive closed loop coarse tuning mechanism 25 will continue to drive the VCO 24 for a predetermined period, referred to as the adapt time, at which time the adapt switch 21 will open. As represented in FIG. 2, Step S220 continuously examines whether the adapt time has elapsed. If the adapt time has elapsed, the system proceeds to Step 230 as described below. However, if the adapt time has not elapsed, the system cycles back to Step S210 and remains in wide band fast lock mode. The adapt time is a function of the dynamics and characteristics of the individual components of the communication device and will be determined and programmed during the construction of the communication device. The primary goal of the adapt time is to establish a maximum quantum of time in which coarse tune frequency can acquire any frequency in the desired bandwidth.

Figure 4:
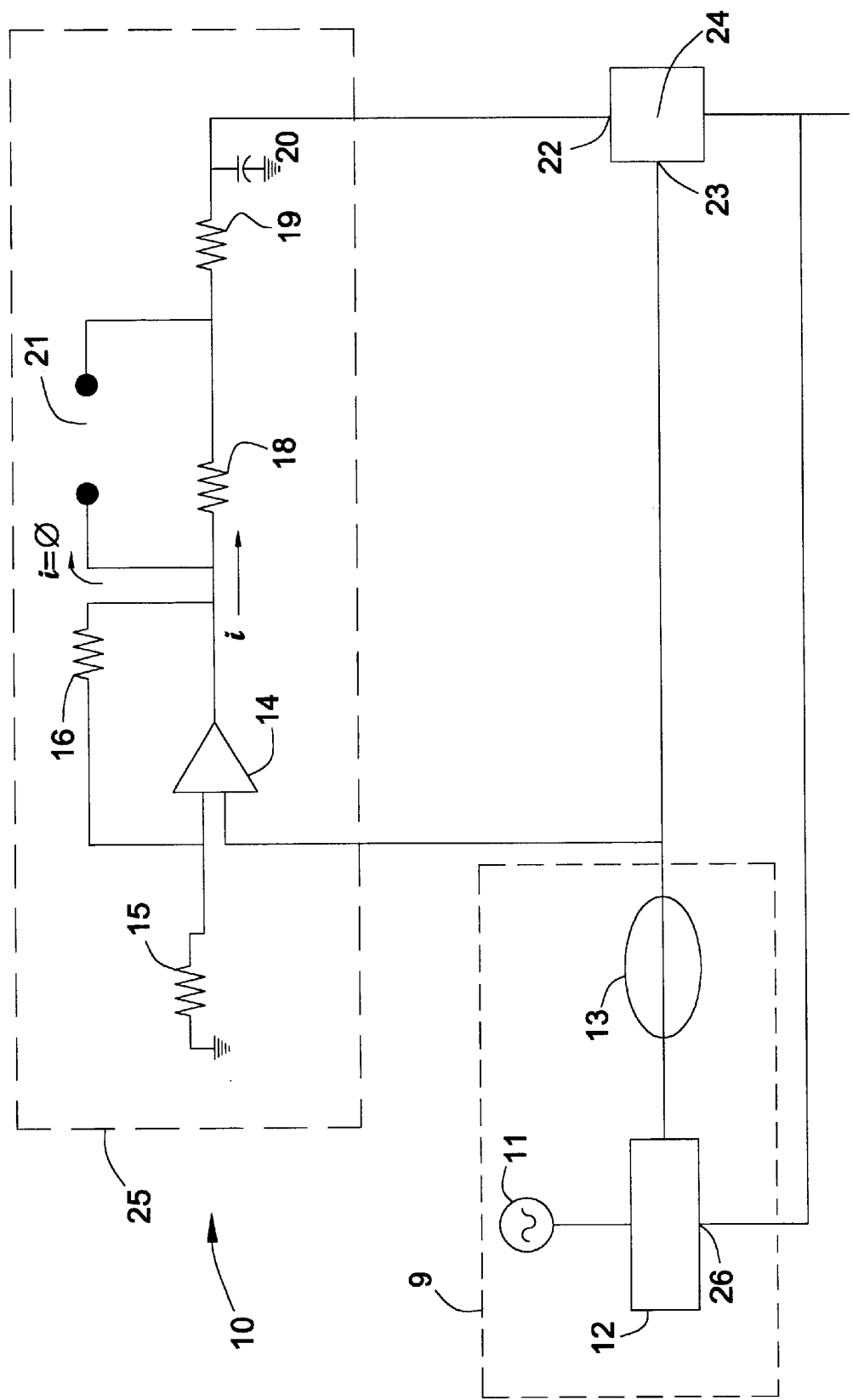
FIG. 4 is a schematic of the adaptive closed loop coarse tuning mechanism circuit of the present invention during narrow band low noise mode.

When the adapt switch 21 is open, the adaptive closed loop coarse tuning mechanism is in narrow band low noise mode as represented in FIG. 2 by Step S230. While in the narrow band low noise mode, the closed loop coarse tuning mechanism has a slow response and virtually no effect on the tuning of the VCO 24. FIG. 4 is a schematic of the adaptive closed loop coarse tuning mechanism in narrow band low noise mode. Because the adapt switch 21 is open, an open circuit exists on the top of the parallel circuit and no current can flow. Therefore, all current being produced by the coarse amp 14 must flow through the bottom parallel resistor 18. Because the parallel resistor 18 is of a high resistance, the current flowing through it will produce a high voltage drop. This high voltage drop across the parallel resistor 18 leaves little or no voltage remaining to drive the coarse tune input 22 of the VCO 24. Consequently, the coarse tune input has been effectively eliminated from operation. Instead, the fine tune input 23, which is still receiving the voltage produced by the loop filter 13, will drive the VCO 24 through the fine tune port 23 to make any minor adjustments to achieve the desired frequency. The synthesizer 12 will continue to produce current until the VCO 24 frequency is equal to the reference frequency.

In the preferred embodiment of the present invention, the voltage controlled oscillator circuit implementing the adaptive closed loop coarse tuning mechanism is used in combination with a portable telephone, such as a cellular telephone, and operates as the primary mechanism for acquiring the cellular frequencies for that portable device. Additionally, in accordance with the present invention, the voltage controlled oscillator circuit is combined in a device having both voice communication and navigational features. Such a device has the ability to acquire and process navigational data, such as global positioning information and also to establish and receive cellular communications, or their equivalent.

In the foregoing specification, the present invention has been described with reference to specific exemplary embodiments thereof The invention is considered to have been described in such full, clear, concise and exact terms as to enable a person of ordinary skill in the art to make and use the same. It will be apparent to those skilled in the art, that a person understanding this invention may conceive of changes or other embodiments or variations, which utilize the principles of this invention without departing from the broader spirit and scope of the invention as set forth in the appended claims. All are considered with the sphere, spirit and scope of the invention. The specification and drawings are, therefore, to be regarded in an illustrative rather than restrictive sense. Accordingly, it is not intended that the invention be limited except as may be necessary in view of the appended claims or their equivalents, which particularly point out and distinctly claim the subject matter applicants regard as their invention.

What is claimed is:

1. A voltage controlled oscillator circuit, said voltage controlled oscillator circuit comprising:

a fine tune mechanism;

a coarse tune mechanism;

a voltage controlled oscillator operably connected to said fine tun mechanisms and said coarse tuning mechanism, wherein said coarse tuning mechanism is comprised of an op amp circuit; and wherein said fine tune mechanism and said coarse tuning mechanism operate in parallel closed loops, said fine tune mechanism having an output connected directly to an input of said coarse tune op amp circuit and also to a fine tune port input of said voltage controlled oscillator, wherein said op amp circuit is incorporated into a noninverting closed loop feedback configuration.

2. The voltage controlled oscillator circuit as recited in claim 1, further comprising a low impedance adapted switch connected in parallel with a resistor to an output of said noninverting closed loop feedback of said op amp.

3. The voltage controlled oscillator circuit as recited in claim 2, wherein said resistor in parallel is of a high resistance.

4. The voltage controlled oscillator circuit as recited in claim 2, further comprising a resistor with a shunt capacitor connected to said output of the op amp circuit and said parallel switch and resistor.

5. The voltage controlled oscillator circuit as recited in claim 4, wherein said parallel resistor is of a magnitude bigger than said resistor connected immediately in series with said parallel resistor.

6. The voltage controlled oscillator circuit as recited in claim 5, wherein the magnitude of difference in resistance value between said parallel resistor and said resistor in series is at least 10 to 1.

7. The voltage controlled oscillator as recited in claim 4, further comprising an output of said resistor and said shunt capacitor connected to a coarse tune port of said voltage controlled oscillator.

8. The voltage controlled oscillator circuit as recited in claim 1, wherein said fine tune mechanism is comprised of:

a frequency generator;

a synthesizer; and a loop filter.

9. The voltage controlled oscillator circuit as recited in claim 8, further comprising a prescalar input from said voltage controlled oscillator connected to said synthesizer.

10. A voltage controlled oscillator circuit, said voltage controlled oscillator circuit comprising:

a fine tune mechanism, said fine tune mechanism comprised of a frequency generator, a synthesizer and a loop filter;

a voltage controlled oscillator, wherein said loop filter has an output connected to a fine tune port of said voltage controlled oscillator and said voltage controlled oscillator is connected to said synthesizer via a prescalar input line; and a coarse tuning mechanism, said coarse tuning mechanism comprised of an op amp circuit configured in a noninverting closed loop feedback loop, a low impedance adapt switch connected in parallel with a resistor to an output of said noninverting closed loop feedback of said op amp circuit, a resistor and a shunt capacitor connected to said parallel switch and resistor, a coarse tune port of a voltage controlled oscillator connected to an output of said resistor and said shunt capacitor.

11. The voltage controlled oscillator circuit as recited in claim 10, wherein said voltage controlled oscillator circuit incorporated in combination with a communication device.

12. The voltage controlled oscillator circuit as recited in claim 11, where said communication device is capable of cellular communication.

13. The voltage controlled oscillator circuit as recited in claim 11, wherein said communication device further comprises a navigational aid.

14. The voltage controlled oscillator circuit as recited in claim 13, wherein said navigational aid has means for acquiring and processing global positioning system data.

15. The method of implementing an adaptive closed loop coarse tuning mechanism with a voltage controlled oscillator, said method comprising:

selecting a desired frequency as a reference;

comparing said reference frequency to a present frequency of said voltage controlled oscillator;

producing a voltage corresponding to a phase difference between said reference frequency and said present voltage controlled oscillator frequency;

utilizing a closed adapt switch to drive an adaptive closed loop coarse tuning mechanism with said voltage;

continuing to drive said adaptive closed loop coarse tune for a preset time; and opening said adapt switch to end adaptive closed loop coarse tuning.

16. The method of implementing an adaptive closed loop coarse tuning mechanism as recited in claim 15, wherein said selection of a desired frequency as a reference is selected by an external control within a communication device.

17. A voltage controlled oscillator circuit, said voltage controlled oscillator circuit comprising:

a fine tune mechanism;

a coarse tuning mechanism;

a voltage controlled oscillator operably connected to said fine tune mechanism and said coarse tuning mechanism, wherein said coarse tuning mechanism is comprised of an op amp circuit;

wherein said fine tune mechanism and said coarse tuning mechanism operate in parallel closed loops and wherein said fine tune mechanism is comprised of a frequency generator, synthesizer, and a loop filter; and a prescaler input from said voltage controlled oscillator to said synthesizer.

* * * * *